United States Patent [19]

Kim

[11] Patent Number: 5,164,830
[45] Date of Patent: Nov. 17, 1992

[54] AUDIO LEVEL EQUALIZATION OF TELEVISION SOUND, BROADCAST FM AND NATIONAL WEATHER SERVICE FM RADIO SIGNALS

[75] Inventor: Yong H. Kim, Singapore, Singapore

[73] Assignee: Thomson Consumer Electronics, S.A., Courbrvoie, France

[21] Appl. No.: 695,803

[22] Filed: May 6, 1991

[51] Int. Cl.⁵ .............................................. H04N 5/50
[52] U.S. Cl. .................................. 358/191.1; 358/189; 358/193.1; 358/198; 358/197; 455/180.1
[58] Field of Search ...................... 358/191.1, 189, 188, 358/194.1, 195.1, 193.1, 198, 196, 197; 455/168, 188, 190, 191, 179, 180, 176, 336, 337

[56] References Cited

U.S. PATENT DOCUMENTS

| | | | |
|---|---|---|---|
| 3,970,773 | 7/1976 | Muterspaugh | 358/197 |
| 4,272,788 | 6/1981 | Ogita | 358/189 |
| 4,599,652 | 7/1986 | Carlson | 358/195.1 |
| 4,633,316 | 12/1986 | Burke | 358/197 |
| 4,698,670 | 10/1987 | Matty | 358/189 |
| 4,907,082 | 3/1990 | Richards | 358/194.1 |

OTHER PUBLICATIONS

P. 2-1 of RCA/GE Color Television Service Data CTC156/157.

P. 2-3 of RCA/GE Color Television Supplemental Service Data CTC156/157-S1.

Primary Examiner—Victor R. Kostak
Assistant Examiner—Sherrie Hsia
Attorney, Agent, or Firm—Joseph S. Tripoli; Peter M. Emanuel; Thomas F. Lenihan

[57] ABSTRACT

A television receiver includes a single tuner for tuning both television channels and broadcast FM stations. The tuner serves as the first conversion stage of a double conversion FM receiver, a separate mixer-oscillator converts the FM radio sound IF to 4.5 MHz for processing in the television receiver's sound channel. A single discriminator circuit is employed for tuning FM radio signals having a first deviation, such as broadcast FM radio signals, and FM signals having a second deviation (i.e., the television sound signals), and FM radio signals having a third deviation, such as signals of the National Weather Service. Circuitry for amplifying the output signal of the discriminator circuit exhibits a first gain, and a first volume control range when amplifying FM signals having the first deviation, exhibits a second gain and the first volume control range, when amplifying FM signals having the second deviation, and exhibits a second gain, and a second volume control range when amplifying FM signals having the third deviation.

3 Claims, 3 Drawing Sheets

AUDIO LEVEL EQUALIZATION OF TELEVISION SOUND, BROADCAST FM AND NATIONAL WEATHER SERVICE FM RADIO SIGNALS

CROSS REFERENCE TO RELATED APPLICATIONS

U.S. Patent applications bearing Ser. Nos. 561,583 561,584 561,585 561,586 561,587 561,588 and 561,589, filed Aug. 6, 1990, 571,857 filed Aug. 23, 1990, and 613,034, filed Nov. 15, 1990, contain related subject matter.

FIELD OF THE INVENTION

The subject application generally concerns the field of FM radio receivers for receiving both broadcast FM and National Weather Service signals, and particularly television receivers including an FM radio for receiving both broadcast FM and National Weather Service signals.

BACKGROUND OF THE INVENTION

In the United States, the broadcast FM radio band occupies a band of frequencies extending from approximately 88 MHz to approximately 108 MHz. This band of frequencies lies between the frequencies allocated for broadcast television channel 6 and television cable channel 98. In addition, the National Weather Service broadcasts FM radio signals in a band of frequencies near 162.5 Mhz. Single-tuner multiband radio receivers having the capability to receive AM, broadcast FM, and National Weather Service radio signals, and television sound signals, are known from, for example, the Windsor Radio, model number 2239, FCC ID number BGK91F2239, manufactured in Hong Kong.

Television receivers having the capability to receive broadcast FM signals are known from the prior art. The Dumont model RA-119A television receiver, manufactured by Allen B. Dumont Laboratories, Passaic, N.J., is an example of a class of television receivers having a single tuner for receiving both television signals and broadcast FM radio signals. This single-tuner class of television receivers was manufactured during the years 1949 to 1952 inclusive, and utilized a continuous tuning arrangement for tuning signals having frequencies between 44 MHz and 217 MHz. This class of television receivers employed a so-called split sound IF system, that is, a separate sound IF channel tuned to 41.25 Mhz. The sound signals for both television and FM radio were demodulated directly from signals at the television sound IF frequency of 41.25 MHz.

Modern television receivers have abandoned the split-sound IF system in favor of the intercarrier sound system, which is less complex, less costly, and more reliable. The intercarrier-sound IF system takes advantage of the fact that the picture and sound carriers are held to close tolerances at the transmitter, ensuring that they are always separated by a constant 4.5 MHz. In an intercarrier-sound IF system, the sound IF signals are amplified along with the picture IF signals in a single IF amplifier. After amplification, the sound signals are converted to a 4.5 MHz intercarrier sound IF frequency by "beating" (i.e., heterodyning) the sound IF signals at 41.25 MHz against a signal at the picture carrier frequency of 45.75 Mhz. The television sound signals are then demodulated from the resulting 4.5 MHz intercarrier signal.

Modern intercarrier-sound type television receivers cannot recover and reproduce broadcast FM radio sound signals, because FM radio signals lack a signal at the picture carrier frequency required by the television receiver circuitry for use in recovering the sound signal. Therefore, as a result of adopting the intercarrier sound system, television manufacturers wanting to provide the capability of receiving broadcast FM radio signals, added a separate FM radio having its own tuner.

Copending U.S. patent Ser. No. 561,588, entitled STEREO FM RADIO IN A TELEVISION RECEIVER (Wignot et al.) discloses a double conversion FM radio in which the first frequency conversion stage is the television tuner. Copending U.S. patent application Ser. No. 561,586, entitled NATIONAL WEATHER RADIO RECEPTION BY SYNTHESIZING ONLY THE CENTER FREQUENCY (Wignot et al.) discloses a system in which a double conversion FM radio using a television tuner as the first conversion stage can receive both FM radio broadcast signals and signals transmitted by the National Weather Service, both of which are processed by the same circuitry, including the same discriminator circuit.

Unfortunately, using the same discriminator circuit for demodulation of both FM broadcast signals and National Weather Service signals causes a problem in that the amplitudes of the recovered signals at the output of the discriminator circuit are vastly different. Recall that the amplitude of the demodulated audio signal is a function of the deviation of the FM carrier frequency from its nominal center frequency. Specifically, the vastly differing amplitude problem occurs because the peak deviation of broadcast FM stereo radio signals is approximately 68 kHz, while the peak deviation of the National Weather Service FM radio signals is only 5 kHz. The difference in the magnitudes of these two signals is equal to $20 \log (68/5) = 22.67$ dB. This situation would force the listener to greatly increase the volume when the receiver is tuned to a National Weather Service station, and to greatly reduce the volume when tuning back to a broadcast FM radio station. The above-described problem is addressed in copending U.S. patent application Ser. No. 613,034, entitled, AUDIO LEVEL EQUALIZATION OF BROADCAST FM AND NATIONAL WEATHER SERVICE FM RADIO SIGNALS (Wignot, et al.)

A television receiver incorporating a monophonic FM radio is disclosed in U.S. Pat. No. 561,589, entitled, MONO FM RADIO IN A TELEVISION RECEIVER (Wignot). In this system, the FM sound IF carrier at 43.5 MHz is not converted to 10.7 MHz for application to a standard FM radio IC, but instead, is converted, via a separate mixer-oscillator unit, to 4.5 MHz for further processing by the audio processing section of the television receiver. When such a system is used to also receive National Weather Service broadcasts, the problem of unequal audio levels is aggravated because there are not only two, but three FM signals of different deviations (i.e., television sound, FM broadcast, and National Weather Service) being applied to the same discriminator.

SUMMARY OF THE INVENTION

In a receiver having a single tuner and a single discriminator circuit employed for tuning FM signals having a first deviation, FM signals having a second deviation, and FM signals having a third deviation, circuitry for amplifying the output signal of the discriminator circuit exhibits a first gain, and a first volume control range when amplifying FM signals having the first deviation, exhibits a second gain and the first volume control range, when amplifying FM signals having the second deviation, and exhibits a second gain, and a second volume control range when amplifying FM signals having the third deviation.

DETAILED DESCRIPTION OF THE EMBODIMENT

Figure 1:
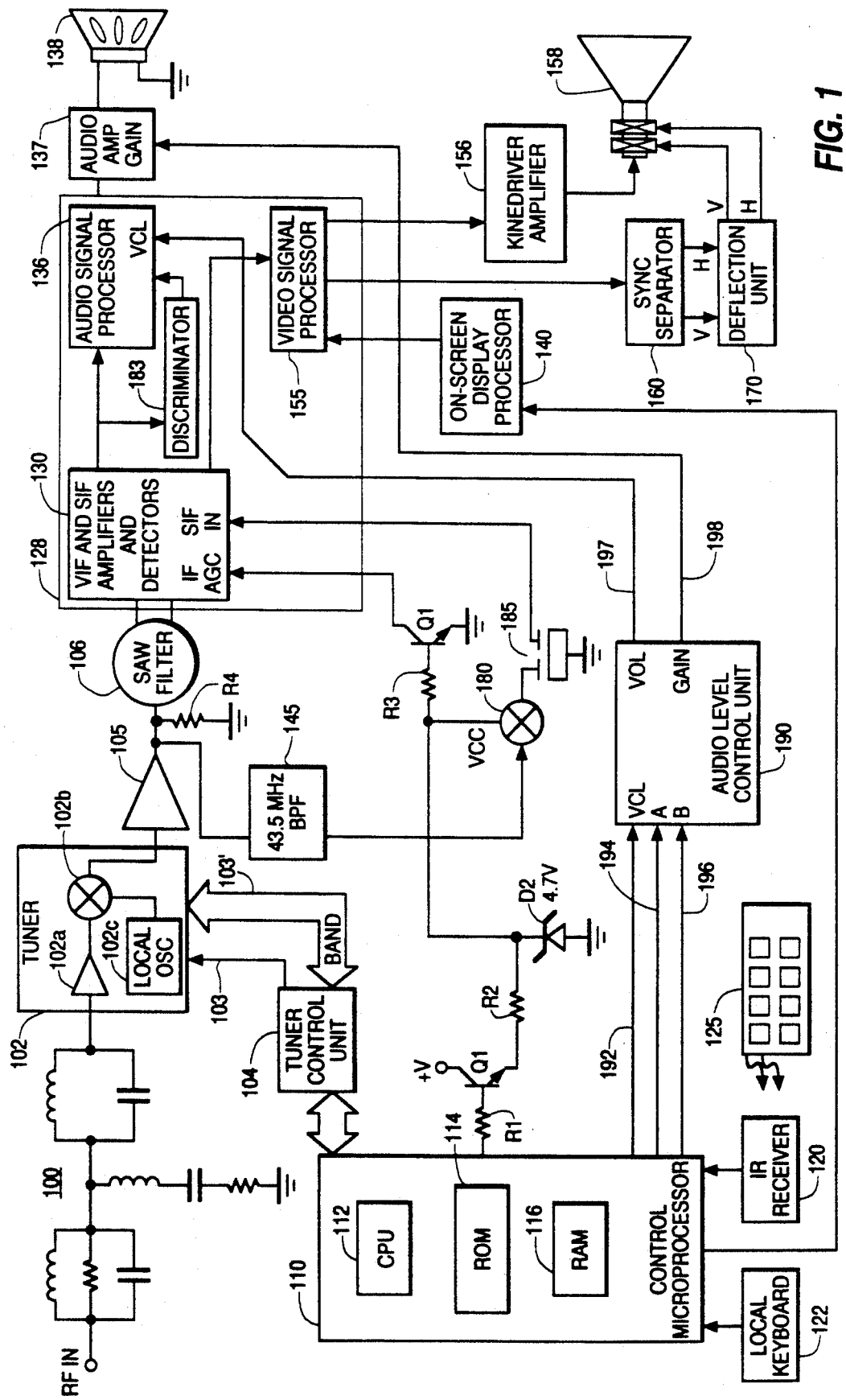
FIG. 1 shows, in block diagram form, a television receiver incorporating the subject invention.

Referring to FIG. 1, television radio frequency (RF) and broadcast FM radio frequency signals are applied to an RF input terminal of an FM trap circuit generally designated 100. FM trap 100 will be described in detail below with respect to FIG. 3. RF signals appearing at the output of FM trap 100 are applied to a tuner 102. Tuner 102 includes an RF amplifier 102a for amplifying RF signals, and applying the amplified RF signals to one input of a mixer 102b. Tuner 102 also includes a local oscillator 102c for generating a local oscillator signal which when applied to a second input of mixer 102b heterodynes with the amplified RF signal and produces an output signal at the television intermediate frequency (IF frequency). Tuner 102 selects a particular RF signal under control of a tuner control unit 104. Alternatively, tuner control unit 104 may also be included within tuner 102. Tuner control unit 104 applies a tuning control signal to tuner 102 via a wire 103, and applies bandswitching signals via a control bus 103'. The tuning control signal and bandswitching signals control the frequency at which local oscillator 102c oscillates, thus determining which RF signal is converted (heterodyned) to the IF frequency. Tuner control unit 104 is controlled by a controller 110. Controller 110, which may be a microprocessor or microcomputer, includes a central processing unit (CPU) 112, a read-only memory (ROM) 114, and a random access memory 116. Controller 110 receives user-entered control signals from a local keyboard 122, and from an infrared (IR) receiver 120. IR receiver 120 receives and decodes remote control signals transmitted by a remote control unit 125.

The intermediate frequency (IF) signal produced by tuner 102 is applied to a surface acoustic wave (SAW) filter preamplifier 105 which amplifies the IF signal and applies it, via SAW filter 106 to a video signal processing unit 130. Video signal processing unit 130 comprises a video IF (VIF) amplifying stage, an automatic gain control circuit (AGC), an automatic fine tuning circuit (AFT), a video detector, and a sound IF (SIF) amplifying stage. Processing unit 130 produces a baseband composite video signal (TV), and a sound carrier signal. The sound carrier signal is applied to an audio signal processor unit 135. Audio signal processor unit 136 produces an audio signal and applies it to an audio amplifier unit 137. Audio amplifier unit 137 produces an amplified baseband audio signal and applies it to a speaker 138 for sound reproduction. Units 130, 136, and 155 are portions of a so-called "one-chip" signal processing integrated circuit (IC) 128.

The baseband video signal (TV) is coupled to a video processor unit 155 and a kine driver amplifier 156, and ultimately displayed on a display screen of a display device 158. Video signals are also applied to a sync separator unit 160 which derives vertical and horizontal synchronizing signals therefrom. The derived vertical and horizontal signals are applied to a deflection unit 170 for the production of deflection signals for application to the yoke assembly of display device 158. Under control of controller 110, an on-screen display processor 140 generates character signals, and applies them to a second input of video signal processor 155, for display on display device 158. The circuitry described thus far, with the exception of the particular FM trap shown in FIG. 1, is known from the RCA CTC 156 color television chassis.

The intermediate frequency (IF) signal produced by tuner 102 is also applied, via the SAW preamplifier 105, and via a 43.5 Mhz bandpass filter 145, to an oscillator-mixer circuit 180. Oscillator-mixer circuit 180 may be a simple, low-cost discrete component self-oscillating mixer circuit, or may be a commercially available crystal-controlled unit such as the TEA5591A, manufactured by Philips. A low-cost discrete component self-oscillating mixer circuit is described in detail in copending U.S. patent application Ser. No. 561,589.

Television tuner 102 is used as the first frequency conversion stage of a double conversion tuner for the FM broadcast band, wherein the second frequency conversion stage of the double conversion tuner is provided by oscillator-mixer circuit 180. That is, a particular FM radio signal is selected and converted in frequency from one of the FM radio band of frequencies, to a first intermediate frequency of 43.5 MHz. The value 43.5 MHz is important and its selection will be discussed below.

The signals at the first IF frequency are then heterodyned in mixer-oscillator 180 with a 48.0 MHz oscillator signal produced by oscillator-mixer circuit 180. The result of the heterodyning process is an FM radio signal at the nominal TV sound IF frequency of 4.5 MHz, which is then filtered in a ceramic resonator 185. Signals at the output of ceramic resonator 185 are then amplified, and detected by the normal television sound IF processing circuitry in processor unit 130, in the normal manner.

Tuner 102 is of the frequency synthesis (FS) type, which means that the frequency of the local oscillator can be changed in a series of steps of a given size under control of controller 100. In FM reception mode, controller 100 causes oscillator 102c to change its frequency in 31.25 kilohertz steps. This means that there can be a mistuning of an FM station by a maximum of 31.25 kHz/2, or 15.625 kHz error. This is acceptable because the FM broadcast frequencies are spaced 200 kHz apart.

The selection of 43.5 MHz as the frequency for the first IF of the double conversion FM radio receiver will now be explained. As is well known, the amplitude vs. frequency characteristic of the tuner is substantially shaped like a haystack, with the chroma carrier and pix carrier residing at respective sides of the haystack approximately 3 db down from the maximum. The approximate center point of the haystack between these two carriers is 44 Mhz. One skilled in the art might believe that this would be the optimum frequency for the first IF of the FM radio system. However, 44 Mhz is almost exactly the half frequency value of the lowest FM radio frequency (at 88.1 MHz), and would cause the following problem. The frequencies of the signals applied to a mixer are doubled by the action of mixing. Most of these products are out of band and filtered out by tuned circuits coupled to the output of the mixers. If 44 MHz is used as the first IF frequency, then local oscillator 102c would oscillate at 132.1 MHz in order to tune an 88.1 MHz FM carrier. In that case the following signals would be produced, 132.1 MHz − 88.1 MHz = 44 MHz (the desired signal); and 2 × 88.1 MHz − 132.1 MHz = 44.1 MHz (undesired image). The undesired image signal is well within the bandwidth of the second IF. This situation causes interference and distortion at the system audio outputs. This is further complicated by the fact that tuner FM traps give very little attenuation at 88.1 MHz causing intermodulation distortion in the tuner to happen at relatively low input signal levels. Frequencies greater than 44 Mhz, but less than the pix carrier at 45.75 MHz, would cause image problems on higher FM radio stations. The best value therefore is one below 44 MHz, but higher than the color carrier at 42.17 MHz (because going lower than the color carrier would cause the signal to drop rapidly down the "haystack"). The value 43.5 MHz is close enough to the crest of the haystack to provide symmetrical signals, and far enough away from 44 MHz to avoid image interference problems. When 43.5 MHz is selected as the first IF frequency, local oscillator 102c would be controlled to oscillate at 131.6 MHz in order to select an FM carrier at 88.1 MHz. this produces the following output signals, 131.6 MHz − 88.1 MHz = 43.5 MHz (the desired signal); and 2 × 88.1 MHz − 131.6 MHz = 44.6 MHz (undesired image). The undesired image signal is now 1.1 MHz away from the desired signal, is well outside the 300 kHz bandwidth of the second IF stage, and will not cause distortion. In fact, a signal having a frequency between 43.5 MHz and the color subcarrier frequency, is a good candidate for the first IF of the above-described double conversion tuner.

In operation, controller 110 receives a command, via local keyboard 122, or via IR receiver 120, to enter the FM radio mode. In response, controller 110 applies a signal to the base of transistor Q1 via resistor R1. Transistor Q1 switches on and provides a source of supply voltage to a voltage regulator circuit R2, D2 which in turn provides power (VCC) to operate oscillator-mixer circuit 180.

The RF amplifier is gain controlled to operate at maximum gain and IF AGC is also set to maximum gain.

Surprisingly, it was found that an FM trap produces a beneficial effect in a television receiver utilizing a single tuner for receiving both television signals and broadcast FM radio signals. Specifically, the FM trap attenuates the FM radio signals which would otherwise have too great an amplitude at the television tuner input. It is also recognized herein that the FM trap should exhibit a frequency response having relatively sharp "skirts" to minimize interference with signals of adjacent television channels, and having a substantially flat band reject region to provide FM signals having a substantially uniform amplitude throughout the FM radio broadcast band.

It is also recognized herein that the subject apparatus can be used to tune broadcasts of the National Weather Service (NWS). These broadcasts are allocated to the following seven frequencies: 162.400 MHz, 162.425 MHz, 162.450 MHz, 162.475 MHz, 162.500 MHz, 162.525 MHz, and 162.550 MHz. Only one of these frequencies is assigned to a given geographic area. Typical weather radio receivers provide a switch for selecting one of three crystal controlled frequencies for receiving the broadcast.

It is further recognized herein that when NWS mode is selected only the center of the NWS band need be tuned. This is true for three reasons. First, the IF filters have a 190 kHz 3 db bandwidth which is greater than the 150 kHz total channel spacing of the NWS band. Second, the discriminator used performs well, even +/−1000 kHz from the tuned frequency. Third, there is little or no overlap of the NWS stations (because the NWS frequencies are reserved, and because there is only one transmitter operating in a given area).

Figure 2:
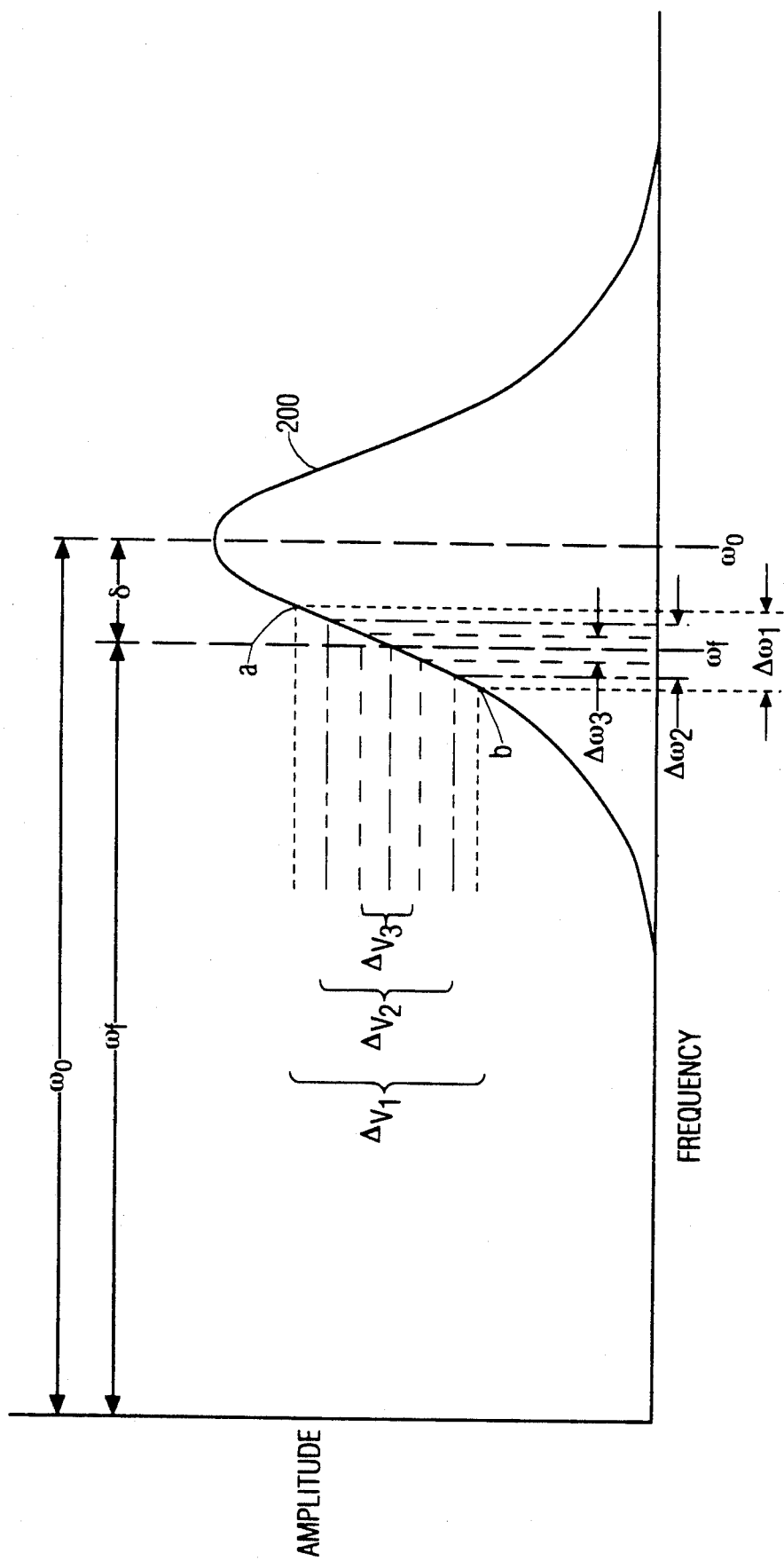
FIG. 2 shows the frequency response of a singletuned discriminator circuit, suitable for use as the discriminator circuit of FIG. 1.
Figure 3:
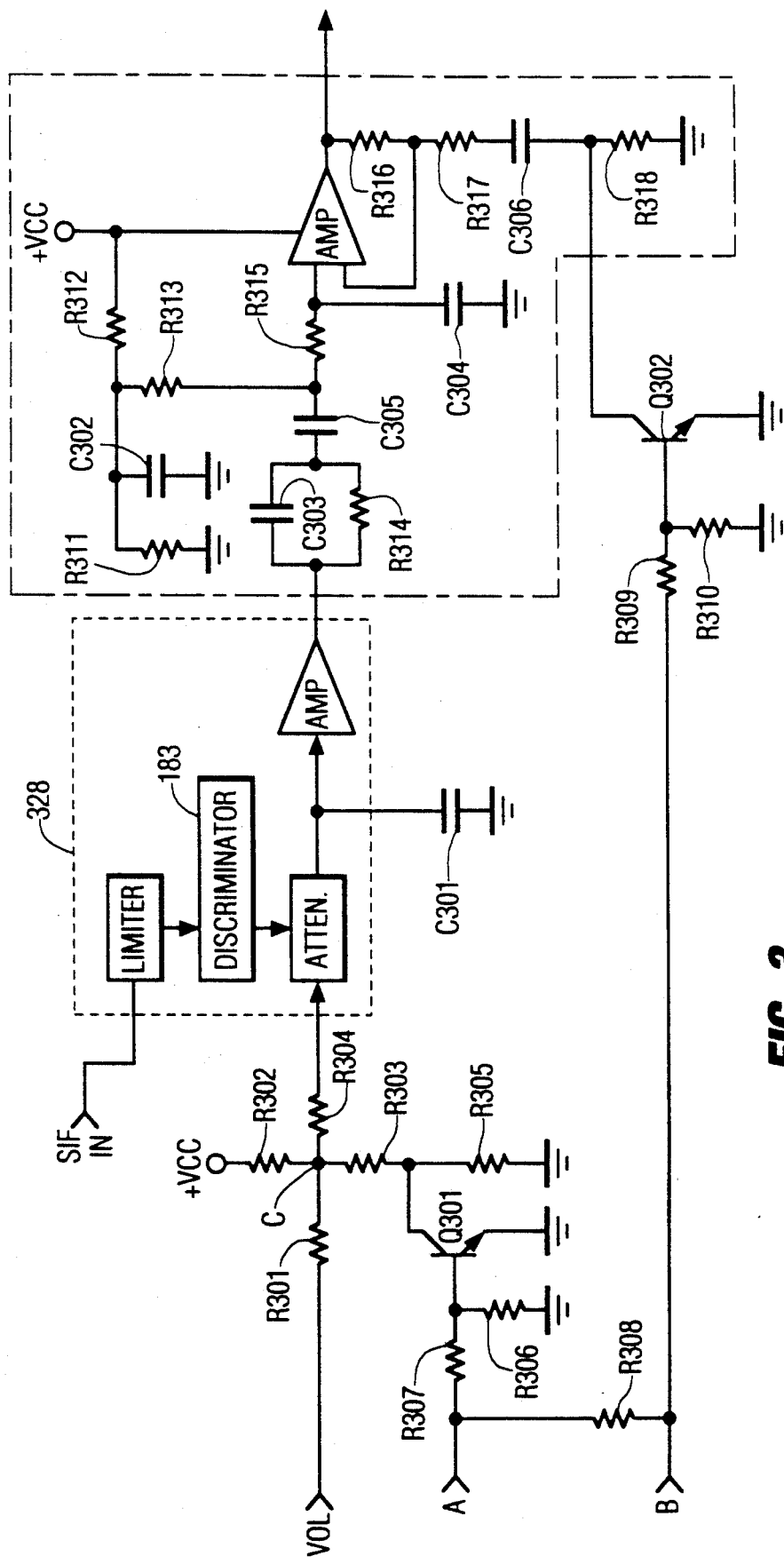
FIG. 3 shows, in schematic form, an embodiment of the audio level control unit of FIG. 1.

The subject invention will now be described with reference to FIGS. 2 and 3. FIG. 2 shows the frequency response 200 of a typical FM discriminator unit, such as discriminator unit 183. In FIG. 2, the symbol $\omega_0$ represents the frequency to which the discriminator is tuned. The symbol $\omega_f$ represents the nominal or center frequency of the FM carrier to be demodulated. The frequency $\omega_f$ is displaced from the tuned frequency $\omega_0$ by an amount $\delta$, such that the center frequency lies on the lower slope of frequency response 200 in the approximate center of a substantially linear region extending between points a and b. For a given frequency deviation $\Delta\omega_1$ of the FM carrier signal, a corresponding signal amplitude change $\Delta V_1$ is produced. Thus, a frequency modulated (FM) carrier signal can be demodulated by applying the carrier to a discriminator exhibiting the characteristics shown in FIG. 2. That is, a frequency deviation of the FM carrier towards point a will produce a larger amplitude output signal, and a frequency deviation of the FM carrier towards point b will produce a smaller amplitude output signal.

As noted above, the same discriminator (i.e., a discriminator within television signal processing IC 128) is used for the demodulation of FM broadcast (i.e. wideband) signals and signals transmitted by the National Weather Service (i.e., narrowband signals) and television sound signals. Broadcast monophonic FM radio signals have a maximum frequency deviation of ±75 kHz for full dynamic range, and broadcast stereophonic (stereo) FM signals have a maximum frequency deviation of approximately ±68 kHz for dynamic range (approximately 10% of the deviation is used by the pilot signal required for stereo demodulation). The ±68 kHz frequency deviation is represented in FIG. 2 by the symbol $\Delta\omega_1$. The frequency modulated carrier transmitted by a television station is exhibits a maximum frequency deviation of ±25 kHz for full dynamic range. The ±25 kHz frequency deviation is represented in FIG. 2 by the symbol $\Delta\omega_2$. The frequency modulated carrier transmitted by the National Weather Service is a narrow band signal, that is, it exhibits a maximum frequency deviation of ±5 kHz for full dynamic range. The ±5 kHz frequency deviation is represented in FIG. 2 by the symbol $\Delta\omega_3$.

When signals of the National Weather Service having a frequency deviation of ±5 kHz ($\Delta\omega_3$) are applied to discriminator 183 they produce a corresponding output signal amplitude in the range shown as $\Delta V_3$. For simplicity, FIG. 2 is not drawn to scale. If it were, the great difference (approximately 22.67 dB) between $\Delta V_1$ and $\Delta V_3$ would even more apparent. The unfortunate result of the great difference in output amplitudes of the demodulated signals of the broadcast FM band and the National Weather Service FM band is that a listener who is tuned to a broadcast FM station would experience a great volume reduction when changing channels to a National Weather Service station. The listener would then be forced to increase the volume by adjusting the volume control in an attempt to reestablish a normal audio level. It is important to note that the output signal amplitude from the discriminator for National Weather Service signals is so low that even at maximum the volume setting the reproduced audio would be unacceptably low. After having increased the volume setting to its maximum position, if the listener then changes channels back to a broadcast FM station, the volume setting would be much too high forcing the listener to once again adjust it for a comfortable listening level. Such repeated readjustment of volume when changing between stations in different FM bands is extremely annoying to a listener.

It is herein recognized that the advantageous use of the same circuitry, from antenna terminals to speakers, for the reception and reproduction of the grossly different FM broadcast radio signals and signals of the National Weather Service, and for television sound signals, created the new unequal-amplitude problem described above. In order to solve the above-described problem some means must be provided for equalizing the amplitudes of signals demodulated from carriers of the two FM bands and the television sound signals.

Referring again to FIG. 1, an audio control unit 190 is coupled to receive volume control (VOL) and gain switching control (A and B) signals from controller 110. Audio level control unit 190 supplies volume control (VOL) signals to the audio amplifier portion 136 of signal processor unit 128, via control line 197, and supplies a gain control signal (GAIN) to audio amplifier unit 137 via control line 198. FIG. 3 shows the circuitry of audio level control unit 190 in detail. Audio level control unit 190 automatically switches amplifier 137 from a first gain setting to a second gain setting, and switches the range of volume control to audio processor unit 136 from a first range to a second range, to compensate for the unequal amplitude input signals. The gain setting and volume control range (i.e., degree of attenuation) for each mode is set forth in Table 1 as follows.

TABLE 1

| MODE | ATTENUATION | GAIN |
|---|---|---|
| TV | LESS | NORMAL |
| NWS | NORMAL | HIGH |
| FM | NORMAL | NORMAL |

The circuit of FIG. 3 accomplishes the desired functions of Table 1 as follows. A voltage divider arrangement comprising resistors R301, R302, R303, R304, and R305 is coupled between a voltage source (+Vcc) and ground. The voltage developed at the junction of resistors R302 and R303 (node C) is coupled to the control input of an attenuator shown within dotted box 328. Dotted box 328 illustrates a portion of the circuitry of signal processing integrated circuit (IC) 128 of FIG. 1. A volume control signal (VOL) is coupled to node C via a coupling resistor R301, and modifies the control voltage developed at node C. The volume control signal (VOL) is generated in controller 110 and coupled to resistor R301 via control line 192 of FIG. 1. A transistor Q301 of a transistor switch arrangement also comprising resistors R306 and R307, has its collector coupled to the junction of resistors R303 and R304, and its emitter coupled to ground. Control signal A, coupled via control line 194, exhibits an active high (i.e., +5 v) in TV mode, and an active low (approximately 0 v) in FM and NWS modes. In TV mode Q301 is turned on in response to signal A, and effectively shorts out (i.e., bypasses) resistor R305, and changing the voltage divider ratio. That is, the voltage developed at node C with Q301 off is equal to (R303 +R305)/(R302+R303+R305)*Vcc. The voltage developed at node C with Q301 on is equal to (R303)/(R302+R303)*Vcc. This change in ratio results in less attenuation for TV sound signals with respect to the attenuation experienced by broadcast FM signals, to compensate for the difference in amplitude between FM broadcast radio signals and amplitude of the television audio signals.

Dotted box 337 contains a typical audio amplifier suitable for use with the invention, and corresponding to the audio amplifier 137 of FIG. 1. Audio amplifier is gaincontrollable by means of changing the feedback ratio of resistor arrangement R316, R317, and R318, by by-passing resistor R318 with a saturated transistor Q302. Shorting out resistor 318 increases the gain of amplifier 337 substantially (i.e., approximately 22 db). Transistor Q302 is turned on in response to an active high level control signal B coupled via control line 196 of FIG. 1 in NWS mode. Remember that during NWS mode signal A is in its low state. Thus the attenuation control signal provided to the attenuator of circuit 328 is in its normal range. In broadcast FM mode, both signals A and B are low, causing both attenuation and gain to be at there normal settings. Thus, the audio levels of TV, FM broadcast radio, and National Weather Service, are equalized.

It is herein specifically recognized that the subject invention is also useful in videocassette recorders (VCRs). The term television receiver, as used herein, includes television receivers having a video display device (commonly known as television sets) and television receivers without a display device, such as VCRs.

What is claimed is:

1. A television receiver including an FM radio receiver, comprising:
    tuner means having a common input terminal for receiving television RF signals, and wideband FM radio RF signals in a first band of frequencies, and narrowband FM radio signals in a second band of frequencies, said tuner means selecting a particular RF signal from a plurality of RF signals in response to a first control signal, converting the frequency of said selected signal to an intermediate frequency and developing said selected intermediate frequency signal at an output;
    intermediate frequency (IF) amplifier means for amplifying said selected intermediate frequency signal;
    control means for generating said first control signal for causing said tuner means to select a particular FM radio RF signal;
    conversion means for converting said intermediate frequency signal to a signal at the television intercarrier sound frequency;
    means for demodulating audio signal from said signal at said television intercarrier sound frequency, said signal at said intercarrier sound frequency being one of television sound signal, broadcast FM signals, and narrowband FM signals;

audio processing means having volume control means for controlling audio volume, said audio processing means receiving said demodulated audio signal, said volume control means being controlled in response to a second control signal automatically generated by said control means in response to a selection of a television signal, said audio processing means producing said television sound signals at a higher level than said narrowband FM signals and said broadcast FM signals;

audio amplifier means for receiving said audio signal from said audio processing means and amplifying said audio signals, said audio amplifier means being controlled to amplify signals in one of a low gain mode of operation and a high gain mode of operation in response to a third control signal;

said control means automatically generating said third control signal for causing said audio amplifier means to switch from said low gain mode of operation to said high gain mode of operation when said tuner means is controlled to tune one of said narrowband FM radio RF signals in said second band of frequencies.

2. The receiver of claim 1 wherein said means for demodulating includes a single discriminator circuit, and said single discriminator circuit is used for demodulating said television sound signals, said wideband signals, and said narrowband signals.

3. The receiver of claim 1 wherein said volume control means of said audio processing means is an attenuator means.

* * * * *